United States Patent
Kantipudi

(10) Patent No.: US 10,446,251 B2
(45) Date of Patent: Oct. 15, 2019

(54) METHODS AND APPARATUS FOR DETECTING DEFECTS IN MEMORY CIRCUITRY

(71) Applicant: Intel Corporation, Santa Clara, CA (US)

(72) Inventor: Kalyana Ravindra Kantipudi, Sunnyvale, CA (US)

(73) Assignee: Intel Corporation, San Jose, CA (US)

( * ) Notice: Subject to any disclaimer, the term of this patent is extended or adjusted under 35 U.S.C. 154(b) by 114 days.

(21) Appl. No.: 15/485,543

(22) Filed: Apr. 12, 2017

(65) Prior Publication Data

US 2018/0301201 A1 Oct. 18, 2018

(51) Int. Cl.
*G11C 29/10* (2006.01)
*G11C 29/52* (2006.01)
*G11C 29/42* (2006.01)
*G11C 29/04* (2006.01)

(52) U.S. Cl.
CPC .............. *G11C 29/10* (2013.01); *G11C 29/42* (2013.01); *G11C 29/52* (2013.01); *G11C 2029/0403* (2013.01); *G11C 2029/0409* (2013.01); *G11C 2029/0411* (2013.01)

(58) Field of Classification Search
CPC ......... G11C 29/10; G11C 29/42; G11C 29/52; G11C 1029/0403; G11C 2029/0409; G11C 2029/0411; G11C 29/44; G01R 31/31813; G01R 31/318385; G06F 11/277
See application file for complete search history.

(56) References Cited

U.S. PATENT DOCUMENTS

| 3,766,521 | A | | 10/1973 | Carter et al. |
| 4,929,889 | A | * | 5/1990 | Seiler .............. G01R 31/31853 714/731 |
| 5,127,014 | A | | 6/1992 | Raynham |
| 5,754,753 | A | | 5/1998 | Smelser |
| 6,101,624 | A | | 8/2000 | Cheng et al. |
| 7,328,377 | B1 | | 2/2008 | Lewis et al. |

(Continued)

OTHER PUBLICATIONS

Donald P. Leach et al., "Digital Principles & Applications" In: "Digital Principles & Applications", 1995 Tata McGraw-Hill Education, XP055116330. p. 196.

(Continued)

*Primary Examiner* — Phung M Chung
(74) *Attorney, Agent, or Firm* — Treyz Law Group, P.C.; Jason Tsai

(57) ABSTRACT

A method of screening for configuration-related defects in integrated circuits is provided. To detect configuration defects, test pattern configuration data and error correction data for that test pattern are loaded into configuration memory. Existing cyclic redundancy check circuitry on the integrated circuit is recruited to compute check-sum signatures based on the data stored in each frame of the memory array. Defects in configuration memory cells and configuration-related circuitry are identified by comparing the error correction data of frame to the computed check-sum signature of a frame. Localized freezing of programmable logic associated with configuration memory is optionally applied to eliminate data contention and ensure maximum coverage of the memory array during screening. Several test patterns of configuration data are also provided.

19 Claims, 7 Drawing Sheets

(56) References Cited

U.S. PATENT DOCUMENTS

| | | | |
|---|---|---|---|
| 7,447,950 B2 | 11/2008 | Takahashi et al. | |
| 7,565,597 B1 | 7/2009 | Branth et al. | |
| 7,634,713 B1* | 12/2009 | Ngo | G01R 31/31816 714/718 |
| 8,032,817 B2* | 10/2011 | Ngo | G01R 31/31816 714/781 |
| 8,281,215 B1* | 10/2012 | Ngo | G06F 11/1004 714/758 |
| 8,369,175 B1 | 2/2013 | Liu et al. | |
| 8,612,814 B1* | 12/2013 | Tan | G11C 29/52 714/732 |
| 8,661,321 B1* | 2/2014 | Ngo | G06F 11/1004 714/766 |
| 8,694,864 B1* | 4/2014 | Ngo | G06F 11/1004 714/725 |
| 8,984,367 B2 | 3/2015 | Ekas et al. | |
| 9,081,062 B1* | 7/2015 | Pedersen | G01R 31/31816 |
| 2001/0010084 A1* | 7/2001 | Lin | G06F 11/1012 714/42 |
| 2003/0156454 A1 | 8/2003 | Wei et al. | |
| 2007/0061668 A1* | 3/2007 | Wickeraad | G06F 11/106 714/758 |
| 2007/0234101 A1 | 10/2007 | Koktan et al. | |
| 2009/0282308 A1 | 11/2009 | Gutsche et al. | |
| 2010/0100779 A1 | 4/2010 | Morlya | |
| 2010/0218072 A1* | 8/2010 | Fukuyama | G06F 11/1048 714/763 |
| 2011/0099459 A1 | 4/2011 | Nakamura et al. | |

OTHER PUBLICATIONS

Thornwood, "Dynamic Switch to Data Slow Mode on a Memory Card", IBM Technical Disclosure Bulletin, International Business Machines Corp, vol. 37, No. 2A, p. 321, Feb. 1, 1994.

Thornwood, "Memory Card Data Fastpath" IBM Technical Disclosure Bulletin, International Business Machines Corp, vol. 37, No. 2A, p. 637-638, Feb. 1, 1994.

* cited by examiner

METHODS AND APPARATUS FOR DETECTING DEFECTS IN MEMORY CIRCUITRY

BACKGROUND

This invention relates to testing integrated circuits, and more particularly, to screening for defects in configuration memory cells of a programmable integrated circuit.

A programmable integrated circuit typically includes thousands of configuration memory elements that store configuration data. The stored configuration data is used to configure programmable logic on the integrated circuit to perform a custom logic function, store data, or otherwise implement a user-specified design. Storing incorrect configuration data due to defects in the configuration memory cells can cause unexpected errors when performing a user-specified function.

Conventional methods of screening for configuration-related defects in a programmable integrated circuit involve writing test configuration data to each configuration random access memory (CRAM) element, unloading the stored CRAM content, and then comparing it to the test data to identify errors. Typically, the integrated circuit chip is held in a dedicated test mode while CRAM content is read out serially from each row of configuration memory to off-chip error detection circuitry.

In practice, this conventional testing method requires the programmable integrated circuit to include a large number of input-output (I/O) pins for testing purposes. Since the contents of multiple rows of CRAM memory are typically unloaded serially through a single I/O pin, high testing speeds cannot be achieved without including a substantial amount of dedicated unloading hardware. Moreover, conventional testing methods are typically performed in the factory prior to shipping and cannot be performed in-field during early stages of the device lifecycle.

It is within this context that the embodiments described herein arise.

BRIEF DESCRIPTION OF THE DRAWINGS

FIGS. 7A, 7B, and 7C are diagrams showing illustrative test data patterns that may be used when screening for configuration-related defects in accordance with an embodiment.

DETAILED DESCRIPTION

The following embodiments describe methods and test circuitry for screening configuration-related defects in a programmable integrated circuit. It will be obvious to one skilled in the art that the present exemplary embodiments may be practiced without some or all of the specific details described herein. In other instances, well-known operations have not been described in detail in order not to unnecessarily obscure the present embodiments.

Figure 1:
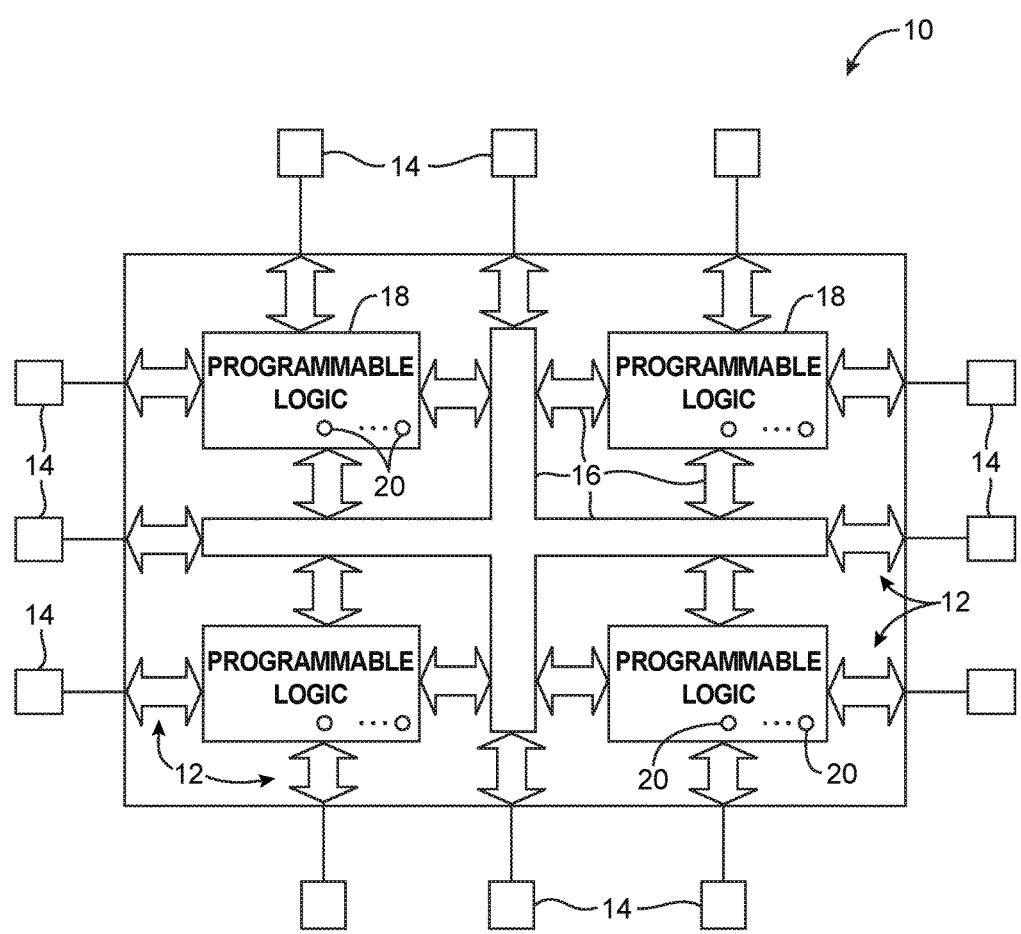
FIG. 1 is a diagram of an illustrative programmable integrated circuit that contains configuration memory cells in accordance with an embodiment.

An illustrative integrated circuit such as a programmable logic device or other programmable integrated circuit with memory is shown in FIG. 1.

Integrated circuit 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input/output circuitry 12. Once loaded, the configuration memory elements each provide a corresponding static control output signal that controls the state of an associated logic component in programmable logic 18. If desired, memory elements 20 may be used in SRAM-type memory arrays (e.g., to store data for processing circuitry during operation of device 10).

Each memory element 20 may be formed from a number of transistors configured to form a bistable circuit. With one suitable approach, complementary metal-oxide-semiconductor (CMOS) integrated circuit technology is used to form the memory elements 20, so CMOS-based memory element implementations are described herein as an example. If desired, other integrated circuit technologies may be used to form the memory elements and the integrated circuit in which the memory elements are used to form memory arrays.

The memory elements may be loaded from an external erasable-programmable read-only memory and control chip or other suitable data source via pins 14 and input/output circuitry 12. Loaded CRAM memory elements 20 may provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc.

The memory elements 20 may be arranged in an array pattern. In a typical modern programmable logic device, there may be millions of memory elements 20 on each chip. During programming operations, the array of memory elements is provided with configuration data by a user (e.g., a logic designer). Once loaded with configuration data, the memory elements 20 selectively control portions of the circuitry in the programmable logic 18 and thereby customize its functions so that it will operate as desired.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

When memory elements 20 are arranged in an array, horizontal and vertical conductors and associated control circuitry may be used to access the memory elements. The control circuitry may, for example, be used to clear all or some of the memory elements. The control circuitry may also write data into the memory elements and may read data from the memory elements. For example, in CRAM arrays, memory elements may be loaded with configuration data. Loaded configuration data may then be read out from the array to confirm proper data loading operations before device 10 is used during normal operation in a system.

Figure 2:
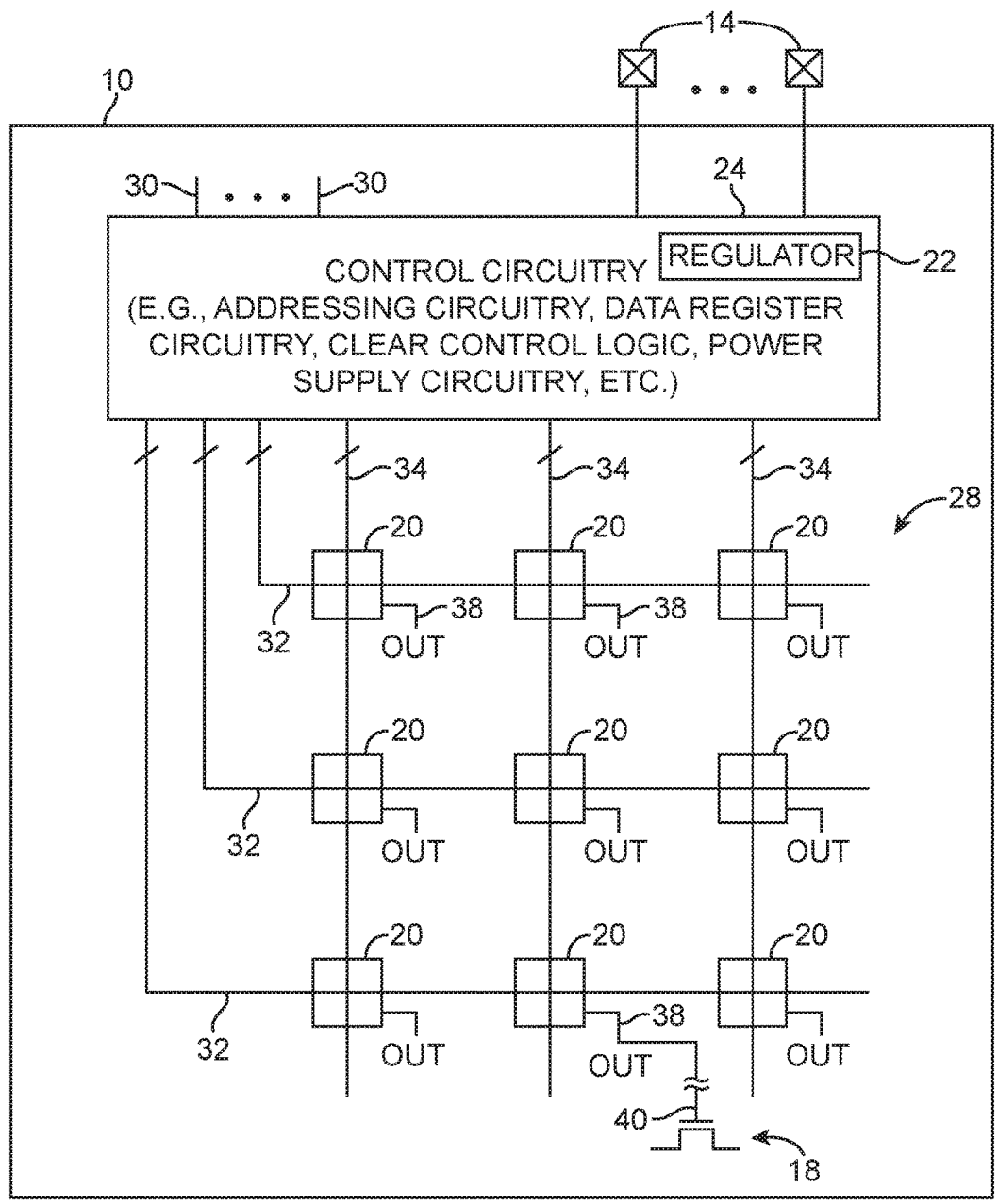
FIG. 2 is a diagram of an illustrative array of configuration memory cells in accordance with an embodiment.

Any suitable memory array architecture may be used for memory elements 20. One suitable arrangement is shown in FIG. 2. As shown in FIG. 2, there may be an array 28 of memory elements 20 in device 10. There are only three rows and columns of elements 20 in the illustrative array of FIG. 2, but in general there may be hundreds or thousands of rows and columns in array 28. Array 28 may be one of a number of arrays on a given device 10, may be a subarray that is part of a larger array, or may be any other suitable group of memory elements 20. Each memory element may supply a corresponding output signal OUT at a corresponding output path 38. In CRAM arrays, each signal OUT is a static output control signal that may be conveyed over a path 40 and used in configuring a corresponding transistor such as transistor 18 or other circuit element in associated programmable logic 18.

Integrated circuit 10 may have control circuitry 24 for supplying signals to memory elements 20 in memory array 28. Control circuitry 24 may receive power supply voltages, data, and other signals from external sources using pins 14 and from internal sources using paths such as paths 30. Control circuitry 24 may include circuitry such as an adjustable voltage supply (regulator 22), address decoder circuitry, address register circuitry, data register circuitry, and clear control circuitry. Regulator 22 may be used to produce time-varying power supply voltages. These power supply voltages may be of the same magnitude as the voltages received on pins 14 or may have different magnitudes than the voltage received from pins 14. Control circuitry 24 (e.g., the addressing circuitry, data register circuitry, clear control circuitry, and other control circuitry of circuitry 24) can use the power supply voltages supplied by pins 14 and by regulator 22 to produce desired time-varying and fixed signals on paths such as paths 32 and 34.

There may, in general, be any suitable number of conductive lines associated with paths 32 and 34. For example, each row of array 28 may have a single associated address line in a respective one of paths 32 that carries a corresponding address signal ADDR (as an example). Each column of array 28 may have a respective path 34 in which a corresponding data line (i.e., a complementary data line) is used to receive a complementary data signal NDATA. A clear signal such as a complementary clear signal NCLR may be routed to all of the cells in array 28 simultaneously over a common clear line.

The signals that are supplied to memory elements 20 may sometimes be collectively referred to as control signals. In particular contexts, some of these signals may be referred to as power signals, clear signals, data signals, address signals, etc. These different signal types are not mutually exclusive. For example, a clear signal for array 28 serves as a type of control signal that can be used to clear array 28. This clear signal also serves as a type of power signal by powering inverter-like circuitry in cells 20. Likewise, because clearing operations serve to place logic zeros in memory cells 20, clear signals may serve as a type of data signal.

Circuitry 24 may load data into array 28. Circuitry 24 may receive data such as configuration data from external sources via input path 30. In a typical programmable logic device system, configuration data is loaded into a programmable logic device from a memory and data loading circuit. This type of circuit, which is sometimes referred to as a configuration device, loads configuration data into registers within circuitry 24. Address decoder circuits in circuitry 24 may receive external control signals or addressing control signals can be generated internally in circuitry 24. Address signals can be controlled independently in each row (or in column-based addressing schemes, in each column).

Configuration data may be loaded into registers in circuitry 24 in series. These registers may then apply the configuration data in parallel to array 28 via data lines (e.g., true data lines, complementary data lines, or both true and complementary data lines). Address decoder circuitry in circuitry 24 can receive addressing information via input 30. The address decoder circuitry can then systematically assert desired address lines 32. As the address line in each row is asserted (i.e., as the signal ADD in a given row is taken high), the data on the data lines 34 is loaded into the memory elements 20 in that column. By addressing each row in this way, the entire array 28 may be loaded with configuration data. After the array has been loaded, the output 38 of each memory element 20 produces a corresponding static control signal for controlling the gate of a pass transistor or other logic component in the programmable logic 18 of the programmable logic device 10 (FIG. 1).

Memory array 28 may contain millions of memory elements 20 and thousands of corresponding signal paths 32 and 34. CRAM addressing and configuration data write operations over paths 32 and 34 may occur simultaneously for each memory element 20 in a given row or column of memory array 28. Given the complexity of the configuration data load operation, even small defects in configuration-related circuitry of device 10 may cause one or more CRAM elements 20 in array 28 to store incorrect configuration bits. For example, configuration-related manufacturing defects may cause a configuration memory element 20 in array 28 to store logic "1" while the configuration data stored in circuitry 24 specifies logic "0" for that element. Alternatively, a configuration-related defect may cause a configuration memory element 20 in array 28 to store a logic "0" while the configuration data stored in circuitry 24 specifies a logic "1" for that element. As a result, configuration-related defects in programmable integrated circuit 10 may cause the contents stored in configuration memory array 28 to be inconsistent with the configuration data supplied to control circuitry 24.

Generally, configuration-related defects may be faults anywhere in integrated circuit 10 that cause a mismatch between the intended configuration bit and the actual static control signal supplied on output 38 of a CRAM element 20. For example, these defects may be manufacturing faults in one or more CRAM elements 20 (i.e., defects within a memory element itself). In some cases, these errors may result from defects in control circuitry 24 or other logic involved in configuration. In other cases these errors may result from defects in configuration-related circuitry such as addressing circuits and bit lines, data register circuits, data bit lines, and other logic for accessing memory elements 20. Typical configuration defect screening protocols, which are only performed in the factory, cannot identify or repair single event upsets that occur after shipping.

Configuration-related defects may cause control signals (i.e., configuration bits) supplied to programmable logic elements 18 to be incorrect. In other words, the actual static control bits provided to programmable logic 18 may be different from the desired configuration bits specified in the configuration data. As a result, these defects in programmable device 10 may cause unexpected errors when implementing a custom logic function specified by the user. A given programmable logic element 18 may be configured differently when implementing different user designs. Thus, the same configuration-related defect may result in drastically different errors during different design implementations, making it difficult for the user to troubleshoot. It may therefore be desirable to efficiently test for configuration-related defects both in-factory prior to shipping programmable device 10 and in-field during the early product lifecycle.

Figure 3:
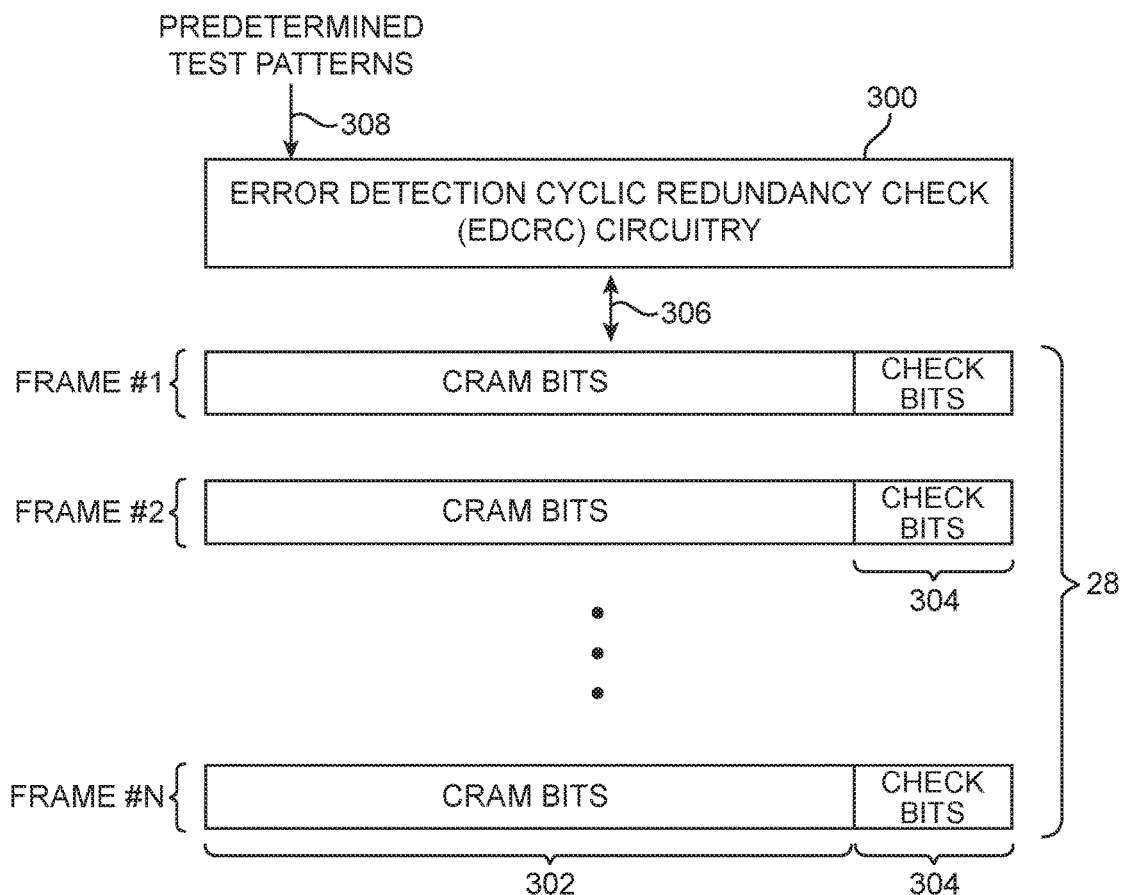
FIG. 3 is a diagram of illustrative error detection circuitry that may be used to screen for configuration-related defects in accordance with an embodiment.

FIG. 3, meant to be illustrative and not limiting, shows a hardware architecture that may be used to screen for configuration related defects. As shown in FIG. 3, internal error detection circuitry such as error detection cyclic redundancy check (EDCRC) circuitry 300 may be coupled to CRAM array 28 by way of one or more signal paths 306. In one embodiment, EDCRC circuitry 300 is a component of programmable integrated circuit 10. Signals may therefore be routed between EDCRC circuit 300 and memory array 28 via signal path 306 without leaving programmable device 10.

Memory array 28 may be partitioned into a number of memory frames (e.g., frame #1, frame #2, . . . frame #N). Referring to FIG. 2, each frame may be a group of memory cells 20 coupled to a common address line 32 (i.e., one or more rows of memory elements in array 28). Alternatively a frame may be a group of memory cells 20 coupled to a common bit line 34 (i.e., one or more columns of memory elements in array 28). The number of rows or columns in memory array 28 assigned to each frame may be the same. Alternatively, different frames may include a different number of rows or columns in memory array 28. Each frame may contain 1, 8, 64, 128 or any other suitable number of rows or columns in CRAM array 28.

Each memory frame may be organized into a memory portion that stores configuration bits 302 and a portion that stores associated check bits 304. In general, the number of configuration bits 302 stored in each frame may be significantly larger than the number of stored check bits 304. CRAM bits 302 and check bits 304 may be read out to EDCRC circuitry 300 on integrated circuit 10 via signal path 306 when screening for configuration defects.

In a typical integrated circuit chip, cyclic redundancy check circuitry is used to detect soft error upsets (SEUs) that affect signals transmitted between two elements of the circuit or data stored in volatile memory elements. Soft error upsets may be caused at random by environmental background radiation or cosmic ray bombardment. In modern programmable devices, there is a chance that a collision between high energy particles and a CRAM cell may cause the CRAM to change state even though the memory cell and corresponding configuration circuitry are not physically damaged. For example, ionizing radiation may cause a voltage inversion so that a CRAM cell storing a "1" configuration bit may flip its state to erroneously store a "0" bit.

Cyclic redundancy check circuitry such as EDCRC circuitry 300 is typically used to monitor configuration data stored in memory and detect random errors due to SEUs. When configuration data is transmitted serially via a communication channel, the CRC mechanism computes a check-sum signature based on the value (i.e. logic "1" or logic "0") of the signal at each clock cycle. This check-sum signature is then compared to a pre-computed check value that corresponds to the expected value of the signal (i.e., the expected contents of configuration memory). If the two values do not match, the signal was not faithfully transmitted and an error may be flagged.

When screening for physical manufacturing defects in configuration memory of a programmable integrated circuit such as device 10, it may be desirable to compare the contents of the configuration memory to test configuration data (i.e., the desired or expected memory contents) without actually reading the memory's contents off-device. Accordingly, the embodiment of FIG. 3 recruits existing CRC circuitry 300 for detecting SEUs on programmable device 10 of FIG. 1 to detect physical manufacturing defects related to writing configuration memory. Screening for manufacturing defects in this manner may reduce or eliminate the need for dedicated unload hardware used during testing.

In one suitable arrangement, EDCRC circuity 300 may receive predetermined test configuration data patterns via signal path 308. A predetermined or fixed test pattern may be supplied from data registers in control circuitry 24 of FIG. 2. Alternatively, signal path 308 may receive the predetermined test pattern from a source external to programmable device 10.

Check bits 304 for each memory frame may be precomputed based on the predetermined test pattern to be loaded onto programmable device 10. Check bits 304 are typically unique to each test pattern, but may not be unique to each memory frame for a given test pattern. For example, when storing CRAM bits 302 associated with a column stripe test pattern (see FIG. 7B), CRAM elements 20 of every other column in memory array store logic "1," while the rest of the array stores logic zero. Since each row in memory array 28 stores identical configuration data in this case (i.e., "010101 . . . "), the CRAM bits 302, and therefore the check bits 304, of each memory frame may be the same. Alternatively, when storing CRAM bits 302 of a checkerboard test pattern (see FIG. 7A), the check bits 304 associated with every other frame may be the same (i.e., check bits 304 of odd frames 1, 3, 5 etc. may be the same, and check bits 304 of even frames 2, 4, 6 etc. may be the same). These examples are merely illustrative. In general, check bits based on any suitable predetermined test pattern may be precomputed and stored in memory array 28.

In the embodiment of FIG. 3, error detection cyclic redundancy check circuitry 300 may use check bits 304 to compare CRAM bits 302 loaded into a given frame of memory array 28 to the expected CRAM contents of the frame (i.e., the test pattern data). In particular, EDCRC circuitry 300 may compute a check-sum signature for each frame of CRAM bits 302. In one embodiment, EDCRC circuitry may compute the check-sum signature associated with a frame after CRAM bits 302 have been loaded. In another embodiment, EDCRC circuitry 300 may compute the check-sum signature associated with a particular frame while CRAM bits 302 are loaded.

Error detection circuitry 300 may then compare the computed check-sum signature with the pre-computed check bits 304. A mismatch between check bits 304 of a CRAM frame and the check-sum signature computed by EDCRC circuitry 300 may indicate the presence of a configuration-related defect associated with that frame of memory array 28.

By computing check-sum signatures corresponding to CRAM bits 302 for each memory frame, EDCRC circuitry 300 may allow the user to narrow the location of the configuration-related defect to a particular frame in memory. Moreover, since EDCRC circuitry 300 may compute check-sum signatures for each memory frame simultaneously (i.e., in parallel) during loading, the embodiment of FIG. 3 may also allow faster testing speeds compared to typical test methods.

Configuration defect screening circuitry like that of FIG. 3 may eliminate the need for dedicated unload and error detect hardware by leveraging the existing EDCRC circuitry on integrated circuit 10. Rather than unloading CRAM bits 302 from the programmable integrated circuit through designated testing I/O pins, the present embodiment uses unload and error detection mechanisms already available to a user design (e.g., signal path 306 and EDCRC circuitry 300). As such, the configuration-related defect screen circuitry of FIG. 3 enables a testing protocol that may be carried out in-field after programmable device 10 leaves the factory.

Figure 4:
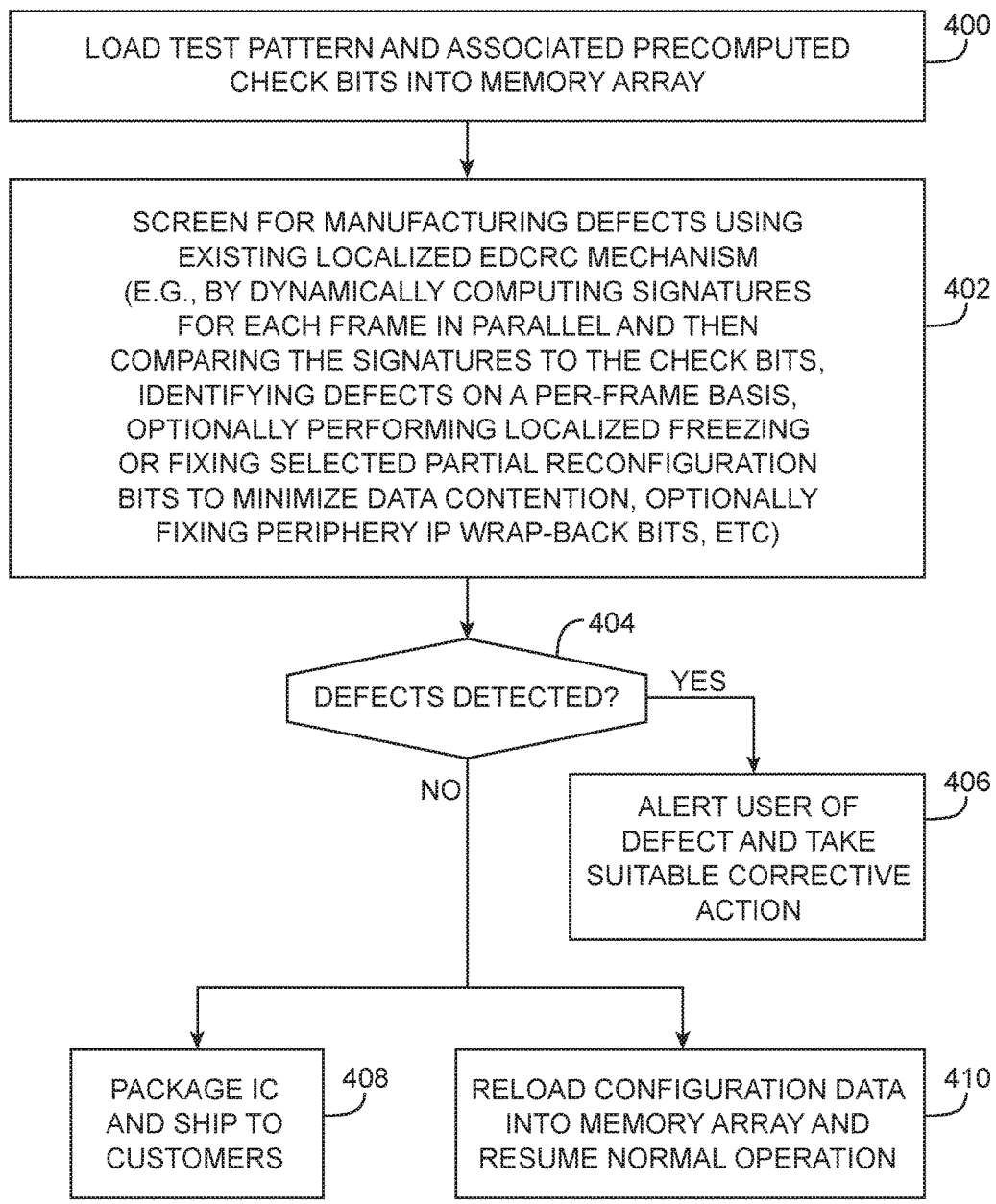
FIG. 4 is a flow chart of illustrative steps for screening configuration defects in accordance with an embodiment.

An illustrative method of screening for configuration-related defects in a programmable integrated circuit using the error detection circuitry of FIG. 3 is shown in the flow chart of FIG. 4. In general, the method of FIG. 4 may be utilized for either in-factory testing or in-field, user level testing of programmable device 10.

Prior to testing, control circuitry 24 of FIG. 2 may send a clear signal to CRAM elements 20 in array 28. The clear signal may erase any residual configuration data stored in memory array 28 (i.e., store logic "0" in all CRAM elements 20). After array 28 has been cleared, configuration data of a test pattern and associated precomputed check bits may be loaded into array 28 at step 400 (e.g., by addressing each row of memory array 28 with a corresponding address signal on path 32 and then writing respective data signals into CRAM elements 20 by way path 34).

During the normal mode of operating programmable device 10, a configuration bitstream (i.e., configuration data) that is generated by a computer-aided design (CAD) tool may be supplied to programmable device 10. For example, the user may produce a design file that, after synthesis, placement, and routing, produces configuration data to implement a custom logic function or other user specified design. The configuration bitstream may then be loaded into programmable device 10 using a configuration device.

When testing for manufacturing defects, however, the configuration device may supply a predetermined test pattern and corresponding check bits to programmable device 10. The desired test pattern may be provided in a .pof or .sof file which may be loaded onto the programmable device over an Ethernet, wireless, or any other suitable connection. When loaded with a test pattern, the integrated circuit may be said to be in "test mode," since the test pattern data does not correspond to configuration data for an actual logic design.

After the test pattern and precomputed check bits have been loaded into configuration memory, configuration-related defects may be detected using the existing localized EDCRC mechanism of the programmable device at step 402. Error detection may be performed by dynamically computing check-sum signatures for the configuration bits stored in each memory frame in parallel. Check-sum signatures for each frame may then be compared to the corresponding check bits for each frame stored in memory. A match between the check-sum signature of a frame and the check bits for that particular frame may indicate that CRAM elements in that frame have stored configuration data that matches the desired test pattern. On the other hand, mismatched values of the check-sum signature and precomputed check bits of a frame may indicate a defect in CRAM elements or configuration-related circuitry of that frame. In this manner, configuration related defects may be identified on a frame-by-frame basis.

In response to detecting configuration-related defects at step 404, an error message reporting the defect and identifying the location of the defect may be reported to the user at step 406. Corrective action may then be taken to repair CRAM elements or configuration circuitry of faulty frames. For a user performing in-field testing, corrective action may include sending the defective programmable device to the manufacturer to be repaired or replaced. Alternatively, an experienced user may adjust pin assignments and make other placement/routing decisions when designing custom logic to avoid recruiting a CRAM frame known to be faulty. If testing is performed in factory, corrective actions may include swapping CRAM elements of a defective frame for new memory cells and/or repairing or replacing bit-lines coupled to the CRAM elements. If configuration-related defects are detected in a large number of memory frames, the faulty programmable device may be discarded altogether.

If no configuration related defects are detected at step 404 during in-factory testing, the integrated circuit may be packaged and shipped to customers at step 408. If no configuration-related defects are detected at step 404 during in-field testing, the user may clear the test pattern data and load a configuration bitstream specifying a custom logic function or other design into the configuration memory array at step 410, thus resuming normal operation of the device.

It may sometimes be necessary to hold a subset of CRAM elements in a fixed state to avoid unwanted data contention in the integrated circuit. Ensuring contention-free testing may require fixing the contents of portions of CRAM memory such that some CRAM elements cannot store test pattern configuration data. As a result, these CRAM elements may not be covered during configuration defect screening, and defects in these CRAM elements may go undetected. It may therefore be desirable to prevent data contention without fixing the state of configuration memory elements in the memory array.

In one embodiment, this may be achieved using local partial reconfiguration (PR) bits, which are generally reconfigurable programmable logic in the integrated circuit during user mode. Local partial reconfiguration bits may be used to locally "freeze" programmable logic blocks in the integrated circuit, thereby preventing contention regardless of the configuration bits stored in corresponding CRAM elements. This localized freezing may be performed on a programmable logic component like that of FIG. 5.

Figure 5:
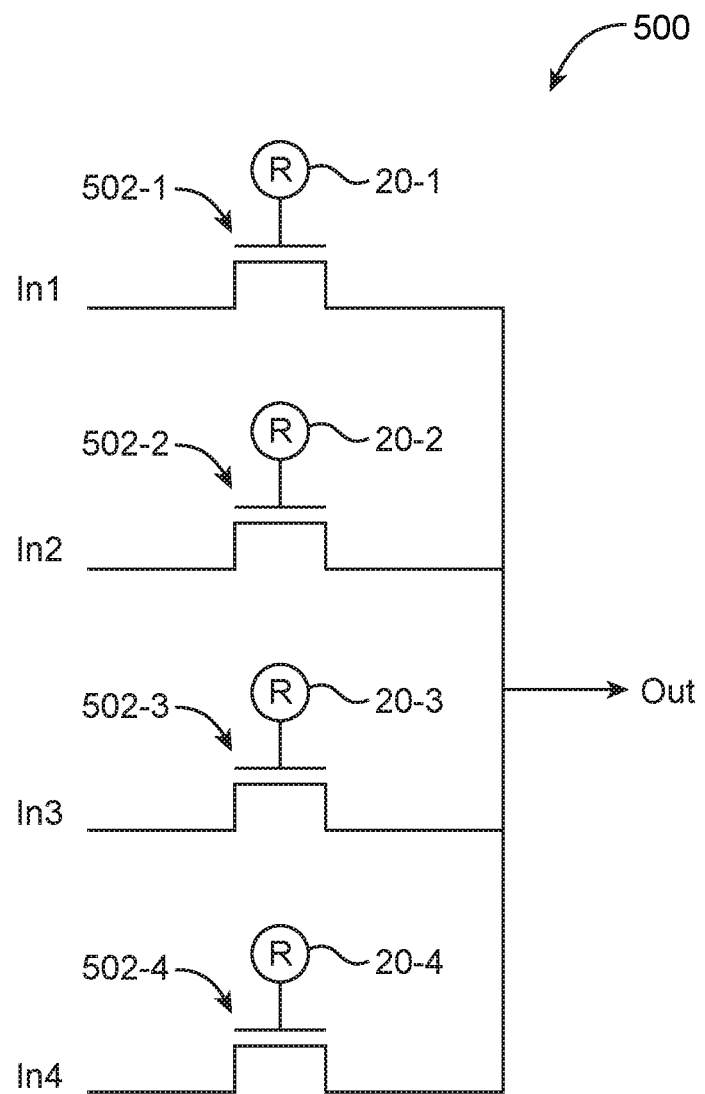
FIG. 5 is a circuit diagram illustrating how localized freezing may help eliminate data contention in accordance with an embodiment.

FIG. 5 shows a one-hot multiplexer 500 with four input terminals. Each input terminal may pass a corresponding input signal (In1, In2, In3, and In4) to multiplexer 500. Each leg of multiplexer 500 may include a transistor 502 as a programmable logic element. The gates of transistors 502-1, 502-2, 502-3, and 502-4 may be coupled to configuration memory elements 20-1, 20-2, 20-3, and 20-4, respectively. Transistors 502 may receive a configuration or control bit from a respective CRAM elements 20 that program (or configure) multiplexer 500. For example, if CRAM 20-1 provides logic "1" to the gate of transistor 502-1, transistor 502-1 may pass through signal In1 to the output of multiplexer 500.

Contention in output line Out may arise if two or more transistors 502 are programmed to drive conflicting signals. For example, CRAM elements 20-1 and 20-2 may be enabled and provide logic "1" to transistors 502-1 and 502-2. If, on a given clock cycle, signal In1 is a logic "1" and signal In2 is a logic "0," transistors 502-1 and 502-2 will drive opposing signal values to the output, resulting in an undesired data contention, which can cause the component to short circuit, consume a substantial amount of power, or otherwise damage device 10. Contention may therefore arise in certain programmable logic components when CRAM elements 20 store test pattern configuration data, since the test pattern may not correspond to an actual logic design.

In the scenario described above, contention may be avoided by forcing input signals In1, In2, In3, and In4 to the same state (also known as localized freezing). In other words, even if all four CRAM cells 20-1, 20-2, 20-3, and 20-4 are on (i.e., passing logic "1" to transistors 502) the same signal will be driven to output by each leg of multiplexer 500. When all inputs to multiplexer 500 are "1" (as an example), the output of the multiplexer will be logic "1" independent of the configuration bits received from CRAM elements 20 and no contention will occur.

Local partial reconfiguration bits may therefore be supplied in configuration data to force all outputs of contention-susceptible programmable logic (IP) to the same state. For example, each of the four multiplexer inputs of FIG. 5 may be connected to a logic OR gate that receives one of input signals In1, In2, In3, or In4 as well as the output of an additional CRAM cell (e.g., a CRAM cell that stores partial reconfiguration bits, not shown). In this case, localized freezing may be performed by supplying partial reconfiguration bits of value "1" to each additional CRAM cell such that the output of each OR gate, and each of the inputs to multiplexer 500, is also logic "1". Providing local PR bits in this way may prevent contention independent of the contents of the configuration memory array. Localized freezing with PR bits may therefore allow a vast majority of configuration memory elements to store test pattern configuration data contention-free, increasing the portion of the CRAM array that may be screened for configuration defects.

Figure 6:
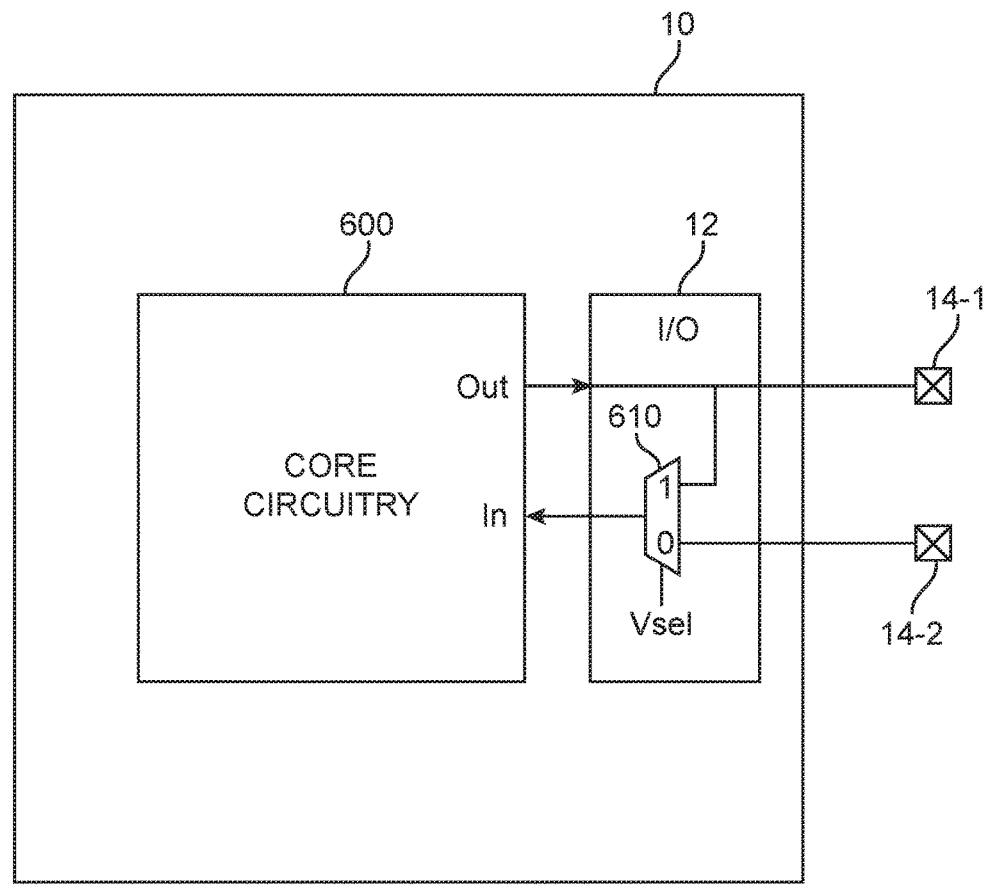
FIG. 6 is a circuit diagram illustrating how localized freezing may implement periphery data wrap-back in accordance with an embodiment.

In another embodiment, localized freezing may be achieved using periphery logic on the programmable device to wrap back signals output from core circuitry. FIG. 6 is a diagram showing how programmable device 10 may include core circuitry 60 and I/O circuitry 12. Core block 600 may store data, execute custom logic functions, perform data processing operations, or otherwise implement a user design. Periphery I/O circuitry 12 may be coupled to I/O pins 14 (e.g., input-output pins 14-1 and 14-2). During normal operation, I/O circuitry may drive signals input to programmable device 10 through input pin 14-2 to core circuitry 606, and may also drive signals from core circuitry 606 off of device 10 through output pin 14-1.

Periphery I/O circuitry 12 may contain routing elements such as multiplexer 610. Multiplexer 610 may receive one or more signals output from core block 600 and one or more signals input to integrated circuit 10 via I/O pins 14. Multiplexer 610 may select either the core output signal or the external input signal based on control signal $V_{sel}$. The selected signal may then be passed to an input of core circuitry 600.

The periphery I/O circuitry 612 may achieve localized freezing by "wrapping back" signals output from IP core 600 back into the core. For example, referring to FIG. 5, programmable logic such as multiplexer 500 may be included in core circuitry 600. The output of multiplexer 500 may be connected to multiplexer 610. The output of multiplexer 610 may in turn be connected to one or more inputs In1, In2, In3, and In4 of multiplexer 500. To implement localized freezing of multiplexer 500, control signal $V_{sel}$ may be provided from top-level control circuitry such that multiplexer 610 wraps the output of multiplexer 500 back to inputs In1, In2, In3, and In4 to force each input to the same state.

As one skilled in the art will understand, the example of a four input one-hot multiplexer of FIG. 5 is merely illustrative. In general, local PR bits may be used to freeze any suitable programmable logic element to avoid data contention during screening. Similarly, freezing of periphery IP wrap-back bits may be achieved in any suitable manner with or without the use of a multiplexer such as multiplexer 610. Thus, the examples of discussed in connection with FIG. 5 and FIG. 6 are merely two ways of implementing localized freezing of programmable logic associated with the configuration memory array of a programmable integrated circuit. In practice, similar localized freezing techniques may be implemented to prevent contention when loading or unloading CRAM contents while screening for configuration related defects.

In another embodiment, localized freezing may be accomplished by selectively providing control signals directly from high-level control circuitry to programmable logic 18 while the programmable device is in user mode. In these classes of devices, contention may be avoided without using local partial reconfiguration bits or periphery IP wrap-back bits to force localized freezing of programmable logic. Selective engagement of localized freezing and EDCRC mechanisms throughout the configuration memory array by way of localized control signals may allow configuration-defect screening to cover the entire memory array without fixing particular CRAM elements. This may allow complete coverage of the configuration memory array during defect screening.

Figures 7A, 7B, 7C:
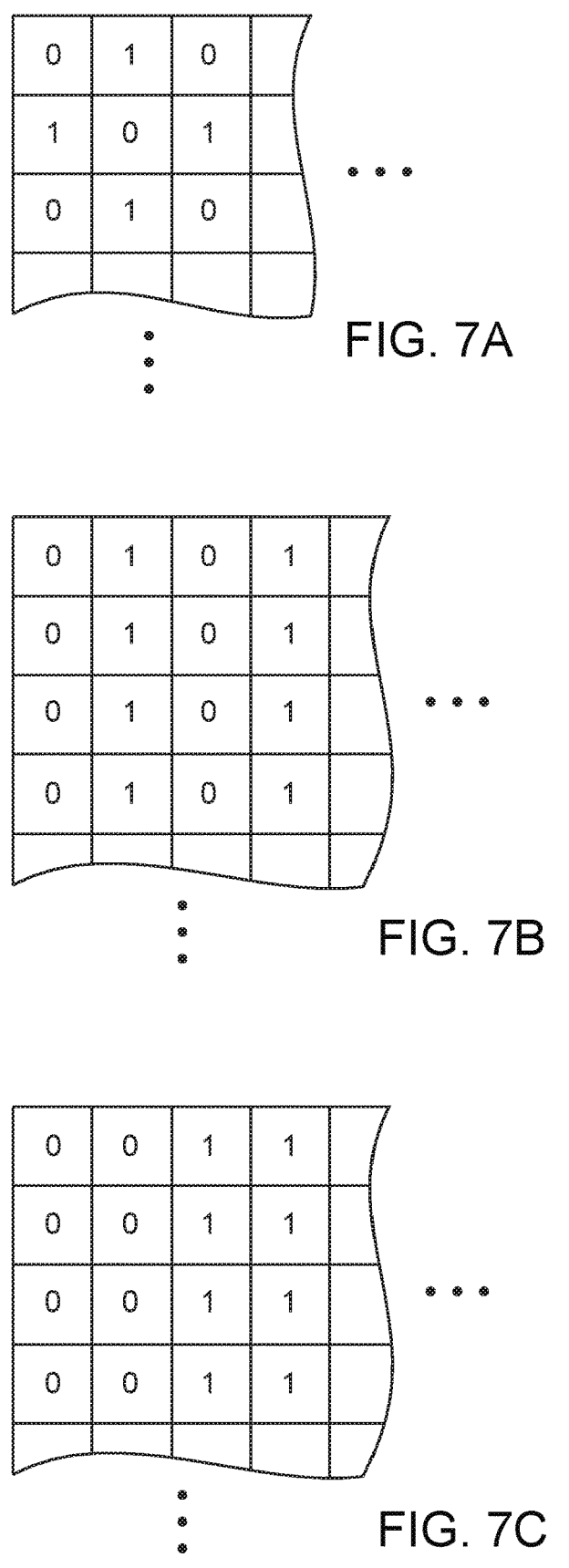

FIGS. 7A-7C show are diagrams showing several illustrative predetermined test patterns that may be loaded into configuration memory when screening for configuration-related defects. The grid patterns shown in FIGS. 7A-7C may correspond to configuration memory array 28 shown in FIG. 2. In particular, a single square in the grid may represent a CRAM cell 20. A "1" inside the square may indicate that the CRAM cell should store a logic "1" in that test pattern, while a "0" inside the square may indicate that the CRAM cell should store a logic "0."

FIG. 7A shows a fixed "checkboard" pattern of test configuration data that may be loaded into a programmable device when screening for configuration related defects. After a checkerboard test pattern is loaded onto the programmable device, CRAM elements 20 each row of memory array 28 may store alternating 1's and 0's (i.e. "01010 . . . "). Every other row in the checkerboard pattern is offset such that CRAM elements 20 in each column of memory 28 also store alternating 1's and 0's, producing a checkerboard like grid of 1's and 0's.

FIG. 7B shows a fixed "column stripe" pattern of test configuration data that may be loaded into a programmable device when screening for configuration related defects.

After a column stripe test pattern is loaded onto the programmable device, CRAM elements 20 in every other column of memory array 28 may store logic "1." Accordingly, each row of in memory array 28 may store identical configuration data (i.e., "01010 . . . "). Thus, when screening for configuration-related defects using a column stripe pattern, the expected CRAM bits 302 stored in each memory frame shown in FIG. 3 should be identical. Precomputed check bits 304 associated with the column stripe test pattern may therefore be the same for each memory frame.

FIG. 7C shows a "double column stripe" pattern of test configuration data that may be loaded into a programmable device when screening for configuration related defects. After a double column stripe test pattern is loaded onto the programmable device, each row in configuration memory array 28 may store alternating "00" and "11" (i.e. "00110011 . . . "). As in the single column stripe test pattern of FIG. 7B, the expected CRAM bits 302 stored in each frame of configuration memory 28 should be identical. Precomputed check bits 304 associated with the double column stripe test may therefore also be the same for each memory frame.

The test patterns illustrated in FIGS. 7A-7C are merely exemplary. In general, any suitable test configuration data and precomputed check bits may be loaded into configuration memory when screening for configuration defects according to the method of FIG. 4.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

EXAMPLES

The following examples pertain to further embodiments.

Example 1 is a method for operating an integrated circuit, comprising: loading test data into memory elements on the integrated circuit; loading error detection data into the memory elements on the integrated circuit; with the error detection circuitry in the integrated circuit, computing a signature from the loaded test data; and comparing the computed signature with the error detection data.

Example 2 is the method of Example 1, wherein loading the test data optionally comprises loading a fixed pattern of bits into the memory elements.

Example 3 is the method of any one of Examples 1-2, wherein loading the test data optionally comprises loading a checkerboard test pattern into the memory elements.

Example 4 is the method of any one of Examples 1-3, wherein loading the test data optionally comprises loading a column stripe test pattern into the memory elements.

Example 5 is the method of any one of Examples 1-4, wherein the memory elements are organized into a plurality of frames, the method further optionally comprising: in response to comparing the computed signature with the error detection data, determining whether a given frame in the plurality of frames contains a defect.

Example 6 is the method of any one of Examples 1-5, wherein the memory elements are organized into a plurality of frames, the method optionally further comprising: in response to comparing the computed signature with the error detection data, determining whether circuitry associated with a given frame in the plurality of frames contains a defect.

Example 7 is the method of any one of Examples 1-6, wherein the error detection data is optionally precomputed based on the test data.

Example 8 is the method of any one of Examples 1-7, the method optionally further comprising: overwriting the test data with configuration data.

Example 9 is the method of any one of Examples 1-8, optionally further comprising: freezing programmable logic circuitry associated with at least a portion of the memory elements to eliminate data contention in the programmable logic circuitry.

Example 10 is the method of any one of Examples 1-9, wherein the integrated circuit includes core circuitry and peripheral circuitry, the method optionally further comprising: freezing bits associated with at least a portion of the peripheral circuitry to ensure that bits output from the core circuitry is fed back into the core circuitry.

Example 11 is an integrated circuit comprising: an array of memory elements, wherein a first portion of the memory elements in the array stores test bits, and wherein a second portion of the memory elements in the array stores check bits; and error detection circuitry that computes a signature for the test bits and that compares the computed signature to the check bits to screen for defects associated with the array of memory elements.

Example 12 is the integrated circuit of Example 11, where the error detection circuitry optionally computes an additional signature for the test bits, and wherein the signature and the additional signature are generated in parallel.

Example 13 is the integrated circuit of any one of Examples 11-12, where the first and second portions of the memory elements are part of a frame in the array, and where the error detection circuitry is optionally configured to determine whether a defect is present in the frame based on the comparison.

Example 14 is the integrated circuit of any one of Examples 11-13, where the error detection circuitry optionally comprises cyclic redundancy check (CRC) circuitry.

Example 15 is the integrated circuit of any one of Examples 11-14, where the test bits comprises a predetermined test pattern, and where the check bits are optionally precomputed based on the predetermined test pattern.

Example 16 is an integrated circuit comprising: means for placing the integrated circuit in a test mode; means for using error detection circuitry on the integrated circuit to screen for manufacturing defects on the integrated circuit while the integrated circuit is in the test mode; means for placing the integrated circuit in a normal mode that is different than the test mode; and means for using the error detection circuitry to detect for random errors on the integrated circuit while the integrated circuit is in the normal mode.

Example 17 is the integrated circuit of Example 16, where the means for placing the integrated circuit in the test mode optionally comprises means for loading a predetermined test pattern into memory elements on the integrated circuit.

Example 18 is the integrated circuit of any one of Examples 16-17, where the means for placing the integrated circuit in the normal mode optionally comprises means for loading a configuration bitstream that is different than the predetermined test pattern into the memory elements on the integrated circuit.

Example 19 is the integrated circuit of any one of Examples 16-18, optionally comprising means for using the configuration bitstream to configure the integrated circuit to perform a custom logic function.

Example 20 is the integrated circuit of any one of Examples 16-19, optionally comprising means for asserting an error signal in response to determining that the integrated circuits contains manufacturing defects; and means for allowing the integrated circuit to be placed in the normal mode in response to determining that the integrated circuits is free of manufacturing defects.

For instance, all optional features of the methods/process described above may also be implemented with respect to the apparatus or integrated circuit described herein. The foregoing is merely illustrative of the principles of this disclosure and various modifications can be made by those skilled in the art.

What is claimed is:

1. A method for operating an integrated circuit that includes memory elements coupled to control circuitry and error detection circuitry, comprising:
    with the control circuitry, loading test data into the memory elements on the integrated circuit;
    with the control circuitry, loading error detection data into the memory elements on the integrated circuit, wherein the error detection data is precomputed based on the test data;
    with the error detection circuitry, computing a checksum signature from the loaded test data; and
    with the error detection circuitry, comparing the computed checksum signature with the error detection data to screen for manufacturing defects associated with the array of memory elements.

2. The method of claim 1, wherein loading the test data comprises loading a fixed pattern of bits into the memory elements.

3. The method of claim 1, wherein loading the test data comprises loading a checkerboard test pattern into the memory elements.

4. The method of claim 1, wherein loading the test data comprises loading a column stripe test pattern into the memory elements.

5. The method of claim 1, wherein the memory elements are organized into a plurality of frames, the method further comprising:
    in response to comparing the computed checksum signature with the error detection data, determining whether a given frame in the plurality of frames that stores the test data from which the checksum signature is computed contains a defect.

6. The method of claim 5, wherein the memory elements are organized into a plurality of frames, the method further comprising:
    in response to comparing the computed checksum signature with the error detection data, determining whether a portion of the control circuitry associated with the given frame contains a defect.

7. The method of claim 1, further comprising:
    with the control circuitry, overwriting the test data with configuration data that configures the integrated circuit to perform a custom logic function, wherein the configuration data is different than the test data.

8. The method of claim 1, wherein the integrated circuit further includes programmable logic circuitry controlled by at least a portion of the memory elements, the method further comprising:
    freezing the programmable logic circuitry to eliminate data contention in the programmable logic circuitry.

9. The method of claim 1, wherein the integrated circuit includes core circuitry and peripheral circuitry configured to convey signals between the core circuitry and input-output pins of the integrated circuit, the method further comprising:
    freezing bits associated with at least a portion of the peripheral circuitry to ensure that bits output from the core circuitry is fed back into the core circuitry.

10. An integrated circuit, comprising:
    an array of memory elements, wherein a first portion of the memory elements in the array stores test bits, wherein a second portion of the memory elements in the array stores check bits, and wherein the check bits are precomputed based on the test bits; and
    error detection circuitry that computes a checksum signature for the test bits and that compares the computed checksum signature to the check bits to screen for manufacturing defects associated with the array of memory elements.

11. The integrated circuit of claim 10, wherein the error detection circuitry further computes an additional signature for the test bits, and wherein the computed checksum signature and the additional signature are generated in parallel.

12. The integrated circuit of claim 10, wherein the first and second portions of the memory elements are part of a frame in the array, and wherein the error detection circuitry is configured to determine whether a defect is present in the frame based on the comparison.

13. The integrated circuit of claim 10, wherein the error detection circuitry comprises cyclic redundancy check (CRC) circuitry.

14. The integrated circuit of claim 10, wherein the test bits comprises a predetermined test pattern, and wherein the check bits are precomputed based on the predetermined test pattern.

15. A method for operating an integrated circuit that includes memory elements coupled to error detection circuitry, comprising:
    storing test bits and check bits on the memory elements, wherein the check bits are precomputed from the test bits prior to storing the test bits on the memory elements;
    with the error detection circuitry, computing a checksum signature from the stored test bits and comparing the computed checksum signature with the precomputed check bits to screen for defects associated with the memory elements; and overwriting the test bits with configuration data that configures the integrated circuit to perform a custom logic function.

16. The method of claim 15, wherein the configuration data is different than the test bits.

17. The method of claim 15, wherein the test bits are only loaded for testing purposes.

18. The method of claim 15, wherein the test bits are not used to configure the integrated circuit to perform any logic function.

19. The method of claim 15, wherein the integrated circuit further includes partial reconfiguration regions, the method further comprising:

freezing at least a portion of the partial reconfiguration regions on the integrated circuit to allow more of the memory elements to store the test bits without risk of contention.

* * * * *